(12) United States Patent
Tsuboi et al.

(10) Patent No.: US 11,282,453 B2
(45) Date of Patent: Mar. 22, 2022

(54) DISPLAY DEVICE AND ELECTRONIC DEVICE

(71) Applicant: CANON KABUSHIKI KAISHA, Tokyo (JP)

(72) Inventors: Hiromasa Tsuboi, Tama (JP); Takehiko Soda, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/027,776

(22) Filed: Sep. 22, 2020

(65) Prior Publication Data

US 2021/0005142 A1  Jan. 7, 2021

Related U.S. Application Data

(63) Continuation of application No. 16/666,831, filed on Oct. 29, 2019, now Pat. No. 10,818,232.

(30) Foreign Application Priority Data

Nov. 6, 2018 (JP) .............................. JP2018-209195

(51) Int. Cl.
*G09G 3/3233* (2016.01)
*H01L 27/32* (2006.01)

(52) U.S. Cl.
CPC ....... *G09G 3/3233* (2013.01); *H01L 27/3265* (2013.01); *H01L 27/3272* (2013.01); *H01L 27/3276* (2013.01); *G09G 2300/0426* (2013.01); *G09G 2300/0809* (2013.01); *G09G 2320/0219* (2013.01); *G09G 2320/0233* (2013.01)

(58) Field of Classification Search
None
See application file for complete search history.

(56) References Cited

U.S. PATENT DOCUMENTS

| | | | |
|---|---|---|---|
| 9,164,601 B2 | 10/2015 | Kubota et al. | |
| 9,666,133 B2 | 5/2017 | Kubota et al. | |
| 10,818,232 B2 * | 10/2020 | Tsuboi | ............... H01L 27/3272 |
| 2010/0024733 A1 | 2/2010 | Soda et al. | |
| 2012/0019498 A1 | 1/2012 | Jeong | |
| 2013/0120338 A1 | 5/2013 | Kubota et al. | |
| 2014/0347347 A1 | 11/2014 | Jeong | |
| 2015/0364090 A1 | 12/2015 | Kim | |

(Continued)

FOREIGN PATENT DOCUMENTS

JP  2013-104890 A  5/2013

*Primary Examiner* — Nicholas J Lee
(74) *Attorney, Agent, or Firm* — Venable LLP

(57) ABSTRACT

A display device including pixels is provided. Each pixels includes a light emitting element, a first transistor configured to supply current to the light emitting element, a second transistor configured to control emission of the light emitting element, a first capacitor including a first electrode and a second electrode, and a second capacitor including a third electrode and a fourth electrode. The first electrode is connected to a gate electrode of the first transistor. The second and third electrodes are connected to a main terminal of the first transistor. The fourth electrode is connected to a main terminal of the second transistor. The first capacitor is arranged between the substrate and the second capacitor. At least a portion of an outer edge of the first electrode is arranged more to an inside than that of the third electrode.

29 Claims, 11 Drawing Sheets

(56) References Cited

U.S. PATENT DOCUMENTS

| | | |
|---|---|---|
| 2015/0379933 A1 | 12/2015 | Kubota et al. |
| 2018/0342203 A1 | 11/2018 | Soda |
| 2019/0355311 A1 | 11/2019 | Ota et al. |
| 2020/0126481 A1 | 4/2020 | Tsuboi |
| 2020/0135826 A1 | 4/2020 | Tsuboi |
| 2020/0143741 A1 | 5/2020 | Tsuboi et al. |

* cited by examiner

DISPLAY DEVICE AND ELECTRONIC DEVICE

This application is a continuation of application Ser. No. 16/666,831 filed Oct. 29, 2019.

FIELD OF THE INVENTION

The present invention relates to a display device and an electronic device.

DESCRIPTION OF THE RELATED ART

A display device in which pixels using organic EL (electroluminescence) elements as light emitting elements are arranged in an array is known. An organic EL element emits light at a luminance in accordance with a current flowing in the organic EL element. Japanese Patent Laid-Open No. 2013-104890 describes an electronic optical device in which are arranged pixels provided with a light emitting element and a driving transistor for supplying current in accordance with a luminance signal to the light emitting element.

SUMMARY OF THE INVENTION

A capacitive element for holding a signal voltage of a luminance signal is connected to the gate electrode of a driving transistor. When a current in accordance with the luminance signal is supplied to the light emitting element in accordance with the driving transistor, a capacitance between an anode and a cathode of the light emitting element is charged, and the potential of the anode increases. When the potential of the anode of the light emitting element changes, it is possible for the voltage of the luminance signal to change in accordance with capacitive coupling between the anode of the light emitting element and an electrode of the capacitive element connected to the gate electrode of the driving transistor. If the voltage of the luminance signal varies, display unevenness will occur in a displayed image.

Some embodiments of the present invention provide techniques that are advantageous for improving image quality in a display device.

According to some embodiments, a display device in which a plurality of pixels are arranged in an array, wherein each of the plurality of pixels includes a light emitting element; a first transistor, provided on a substrate, configured to supply current in accordance with a luminance signal to the light emitting element; a second transistor, provided on the substrate, configured to control emission or non-emission of the light emitting element; a first capacitive element that includes a first electrode and a second electrode; and a second capacitive element that includes a third electrode and a fourth electrode, wherein the first electrode is connected to a gate electrode of the first transistor, the second electrode and the third electrode are connected to, from out of two main terminals of the first transistor, a main terminal on a side of the second transistor, the fourth electrode is connected to, from out of the two main terminals of the second transistor, a main terminal on a side opposite the first transistor, in a cross sectional view, the first capacitive element and the second capacitive element are arranged between the light emitting element and the substrate, and the first capacitive element is arranged between the substrate and the second capacitive element, and in a plan view, an outer edge of the first electrode has a first side and a second side opposite the first side, and at least a portion of each of the first side and the second side are arranged more to an inside than an outer edge of the third electrode, is provided.

Further features of the present invention will become apparent from the following description of exemplary embodiments (with reference to the attached drawings).

DESCRIPTION OF THE EMBODIMENTS

Figure 1:
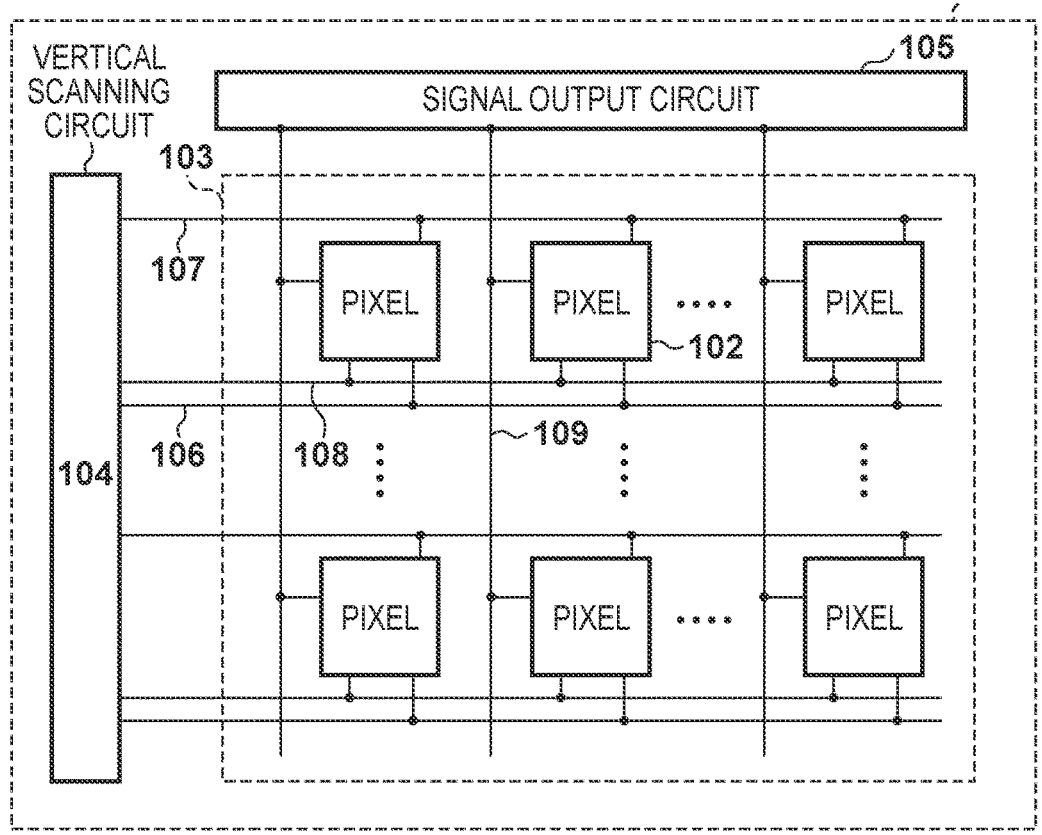
FIG. 1 is a diagram illustrating an example of a configuration of a display device according to an embodiment of the present invention.

Hereinafter, specific embodiments of a storage apparatus according to the present invention will be described with reference to the accompanying drawings. In the following description and the drawings, the same reference numerals are given for the same components throughout the plurality of drawings. Therefore, a common configuration will be described with reference to a plurality of drawings, and a description of a configuration to which a common symbol is assigned will be omitted as appropriate.

Figure 2:
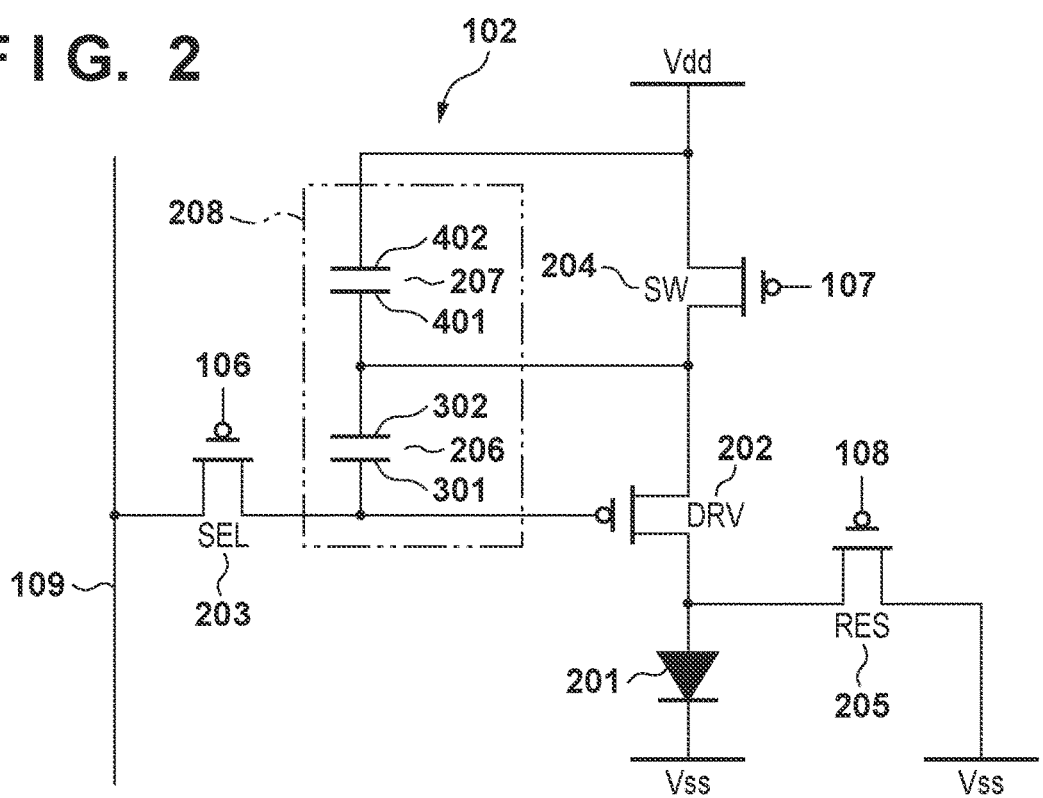
FIG. 2 is a circuit diagram illustrating an example of the configuration of a pixel of the display device of FIG. 1.

Referring to FIGS. 1 to 12, a configuration of a display device according to an embodiment of the present invention will be described. FIG. 1 is a diagram illustrating an example of a configuration of a display device 101 of the present invention, and FIG. 2 is a circuit diagram of a pixel 102 arranged in the display device 101.

Description is given below regarding a case where a driving transistor 202 is connected to an anode of a light emitting element 201 arranged in each pixel 102 of the display device 101, and all the transistors arranged in the pixel 102 are P-type transistors. However, the structure of the pixel 102 of the display device 101 is not limited to this. For example, the polarities and conductivity types of the respective transistors or the like may all be reversed. Further, for example, a driving transistor may be a P-type transistor, and other transistors may be an N-type transistor. A connection or a potential that is supplied may be changed as appropriate in accordance with the conductivity type or polarity of a light emitting element or a transistor included in the pixel 102 of the display device 101.

In the present embodiment, as illustrated in FIG. 1, the display device 101 includes a pixel array portion 103 and a driving portion arranged around the pixel array portion 103. The pixel array portion 103 includes, on a side of a front surface of a substrate as described later, a plurality of pixels 102 arranged in an array. Each pixel 102 comprises a light emitting element 201 as illustrated by FIG. 2. The light emitting element 201 is provided with an anode and a cathode, and has an organic layer that includes a light-emitting layer between the anode and the cathode. The organic layer may have, as appropriate, one or more of a hole injection layer, a hole transport layer, an electron injection layer, and an electron transport layer in addition to the light emitting layer.

The driving portion is a circuit for driving the pixels 102 arranged in the pixel array portion 103. The driving portion includes, for example, a vertical scanning circuit 104 and a signal output circuit 105. In addition, in order to supply a signal from the driving portion to the pixels 102, in the pixel array portion 103, scanning lines 106, 107 and 108 extending along the row direction (horizontal direction in FIG. 1) are arranged for each pixel row of the pixels 102 arranged in an array. In the pixel array portion 103, a signal line 109 extending along the column direction (vertical direction in FIG. 1) is arranged for each pixel column of the pixels 102 that are arranged in an array.

The scanning lines 106, the scanning lines 107, and the scanning lines 108 are connected to respective pixel row output terminals of the vertical scanning circuit 104. The signal lines 109 are connected to respectively corresponding pixel column output terminals of the signal output circuit 105.

At the time of writing a luminance signal to each pixel 102 of the pixel array portion 103, the vertical scanning circuit 104 supplies a writing control signal to the corresponding scanning line 106. Further, the vertical scanning circuit 104 supplies, to the scanning line 107, a light emission control signal for driving the pixel 102 to cause it to emit light. Furthermore, the vertical scanning circuit 104 supplies, to the scanning line 108, a reset signal for resetting the light emitting element 201 of the pixel 102.

The signal output circuit 105 appropriately selects one of a luminance signal having a voltage corresponding to luminance information for a time of causing the light emitting element 201 of each pixel 102 to emit light, and a reference voltage signal having a reference voltage, and outputs the selected signal to the signal line 109. The luminance signal represents luminance in each pixel 102 of an image displayed on the display device 101, and may also be referred to as an image signal.

Next, using FIG. 2, description is given regarding a circuit configuration of the pixel 102 of the present embodiment. Each of the plurality of pixels 102 includes a light emitting element 201 that configures a current path, a driving transistor 202 (first transistor) for supplying current in accordance with a luminance signal to the light emitting element 201, and a light emission control transistor 204 (second transistor) for controlling emission or non-emission of the light emitting element 201. In addition, each pixel 102 includes a writing transistor 203 (third transistor) for transmitting a luminance signal to the gate electrode of the driving transistor 202. Furthermore, each pixel 102 includes a reset transistor 205 (fourth transistor) for performing a reset by shorting the two electrodes of the light emitting element 201. In addition, each pixel 102 includes a capacitive element 206 (first capacitive element) and a capacitive element 207 (second capacitive element).

Here, the total number of transistors and capacitive elements and the combination of conductivity types of the transistors are merely an example and there is no limitation to this structure. For example, in a case of forming a pixel 102 with a smaller area, the reset transistor 205 may be omitted.

In the following description, when expressing that a transistor is connected between an element A and an element B, one main terminal of the transistor is connected to the element A, and the other main terminal of the transistor is connected to the element B. That is, when expressing that a transistor is connected between the element A and the element B, a case where the control terminal of the transistor is connected to the element A, one main terminal is not connected to the element A, and the other main terminal is not connected to the element B is not included. Here, the main terminals of a transistor refers to diffusion regions that functions as a source region or a drain region or the transistor. In addition, the control terminal of a transistor refers to the gate electrode of the transistor.

In the configuration illustrated in FIG. 2, one end of a current path including the light emitting element 201, the driving transistor 202, and the light emission control transistor 204 is connected to the power supply potential Vss, and the other end is connected to the power supply potential Vdd. More specifically, the cathode of the light emitting element 201 is connected to the power supply potential Vss, and one of the main terminals of the light emission control transistor 204 (the source region in the configuration of FIG. 2) is connected to the power supply potential Vdd. However, there is no limitation to this, and other elements may be arranged between the power supply potential Vss and the light emitting element 201 or between the power supply potential Vdd and the light emission control transistor 204. Other elements may be provided between the light emitting element 201 and the driving transistor 202 or between the driving transistor 202 and the light emission control transistor 204. In the configuration illustrated in FIG. 2, the driving transistor 202 is arranged between the light emitting element 201 and the light emission control transistor 204, but the light emission control transistor 204 may be arranged between the light emitting element 201 and the driving transistor 202.

One of the main terminals of the driving transistor 202 (the drain region in the configuration of FIG. 2) is connected to the anode of the light emitting element 201. The control terminal of the driving transistor 202 is connected to one of the main terminals (the drain region in the configuration of FIG. 2) of the writing transistor 203. The driving transistor 202 supplies a current corresponding to a luminance signal to the light emitting element 201 to drive the light emitting element 201.

The light emission control transistor 204 is arranged between the power supply potential Vdd for supplying a drive current to the driving transistor 202 and the driving transistor 202. More specifically, as described above, one main terminal of the light emission control transistor 204 (the source region in the configuration of FIG. 2) is connected to the power supply potential Vdd. The other main terminal of the light emission control transistor 204 (the drain region in the configuration of FIG. 2) is connected to the other main terminal of the driving transistor 202 (the source region in the configuration of FIG. 2). In addition, the control terminal of the light emission control transistor 204 is connected to the scanning line 107. In the structure illustrated in FIG. 2, the power supply potential Vdd is higher than the power supply potential Vss.

The writing transistor 203 is arranged between the signal line 109 and the control terminal of the driving transistor 202. More specifically, one main terminal of the writing transistor 203 is connected to the control terminal of the driving transistor 202 as described above, and the other main terminal of the writing transistor 203 is connected to the signal line 109. In addition, the control terminal of the writing transistor 203 is connected to the scanning line 106.

One main terminal of the reset transistor 205 (a source region in the configuration of FIG. 2) is connected to the anode of the light emitting element 201 and one main terminal of the driving transistor 202 (a drain region in the configuration of FIG. 2). The other main terminal of the reset transistor 205 (the drain region in the configuration of FIG. 2) is connected to the power supply potential Vss. In addition, the control terminal of the reset transistor 205 is connected to the scanning line 108. In the non-light-emitting period, by the reset transistor 205 entering the conductive state, the anode of the light emitting element 201 is connected to the power supply potential Vss, and the two electrodes of the light emitting element 201 are short-circuited. By this, the light emitting element 201 can be brought into a non-light emitting state (a reset operation). By providing the reset transistor 205 in the pixel 102, it is possible to cause the light emitting element 201 to reliably have a black display in a non-light-emitting period, and realize a high contrast ratio in the display device 101.

The capacitive element 206 includes an electrode 301 (first electrode) and an electrode 302 (second electrode). The capacitive element 207 includes an electrode 401 (third electrode) and an electrode 402 (fourth electrode). The electrode 301 is connected to the control terminal (gate electrode) of the driving transistor 202. The electrode 302 and the electrode 401 are connected to, from out of the two main terminals of the driving transistor 202, the main terminal on the side of the light emission control transistor 204. In other words, in a current path including the light emitting element 201, the driving transistor 202, and the light emission control transistor 204, the electrodes 302 and 401 are connected to a node between the driving transistor 202 and the light emission control transistor 204. The electrode 402 is connected to, from out of the two main terminals of the light emission control transistor 204, the main terminal on a side opposite to the driving transistor 202. In the configuration illustrated in FIG. 2, the electrode 402 is connected to a node between the light emission control transistor 204 and the power supply potential Vdd. Here, the capacitive element 206 and the capacitive element 207 as illustrated in FIG. 2 configure a capacitive element unit 208.

The driving transistor 202 supplies a current from the power supply potential Vdd to the light emitting element 201 via the light emission control transistor 204, and causes the light emitting element 201 to emit light. More specifically, the driving transistor 202 supplies a current corresponding to the signal voltage of the luminance signal held in the capacitive element 206 to the light emitting element 201. By this, the light emitting element 201 emits light by current driving.

The writing transistor 203 enters a conductive state in response to a writing control signal applied from the vertical scanning circuit 104 to the control terminal via the scanning line 106. By this, the writing transistor 203 samples the signal voltage or the reference voltage of the luminance signal according to the luminance information supplied from the signal output circuit 105 via the signal line 109, and writes a result of the sampling to the pixel 102. The written signal voltage or reference voltage is applied to the control terminal of the driving transistor 202 and is held in the capacitive element 206. That is, the writing transistor 203 is arranged to transmit a luminance signal for causing the light emitting element 201 to emit light at a luminance corresponding to the luminance information, and transmits the luminance signal to the control terminal of the driving transistor 202.

The light emission control transistor 204 enters a conductive state in response to a light emission control signal applied from the vertical scanning circuit 104 to its control terminal via the scanning line 107, thereby allowing the supply of current from the power supply potential Vdd to the driving transistor 202. By this, as described above, the driving of the light emitting element 201 by the driving transistor 202 becomes possible. In other words, the light emission control transistor 204 functions as a switch element for controlling light emission/non-light emission of the light emitting element 201 by controlling the conductive state of the current path.

In this manner, a period in which the light emitting element 201 is in a non-light-emitting state (a non-light-emitting period) is provided in accordance with a switching operation of the light emission control transistor 204, and the ratio between a light-emitting period in which the light emitting element 201 emits light and a non-light-emitting period can be controlled (so-called duty control). By this duty control that controls emission/non-emission of the light emitting element 201, it is possible to reduce blurring of an afterimage accompanying light emission by the light emitting element 201 of each pixel 102 over one frame period, and in particular, it is possible to make the image quality of a moving image be more advantageous.

As the light emitting element 201, an organic EL (Organic Electroluminescent) element can be used. When the light emitting element 201 emits light, the amount of current flowing through the driving transistor 202 changes in accordance with the signal voltage applied from the signal line 109 to the control terminal of the driving transistor 202 via the writing transistor 203. As a result, the capacitance between the anode and the cathode of the light emitting element 201 is charged to a predetermined potential, and a current corresponding to the potential difference flows. By this, the light emitting element 201 emits light at a predetermined luminance.

Next, using FIGS. 3 to 8, description is given regarding details of arrangement of the driving transistor 202, the light emission control transistor 204, the reset transistor 205, and the capacitive elements 206 and 207 included in the pixel 102.

Figure 3:
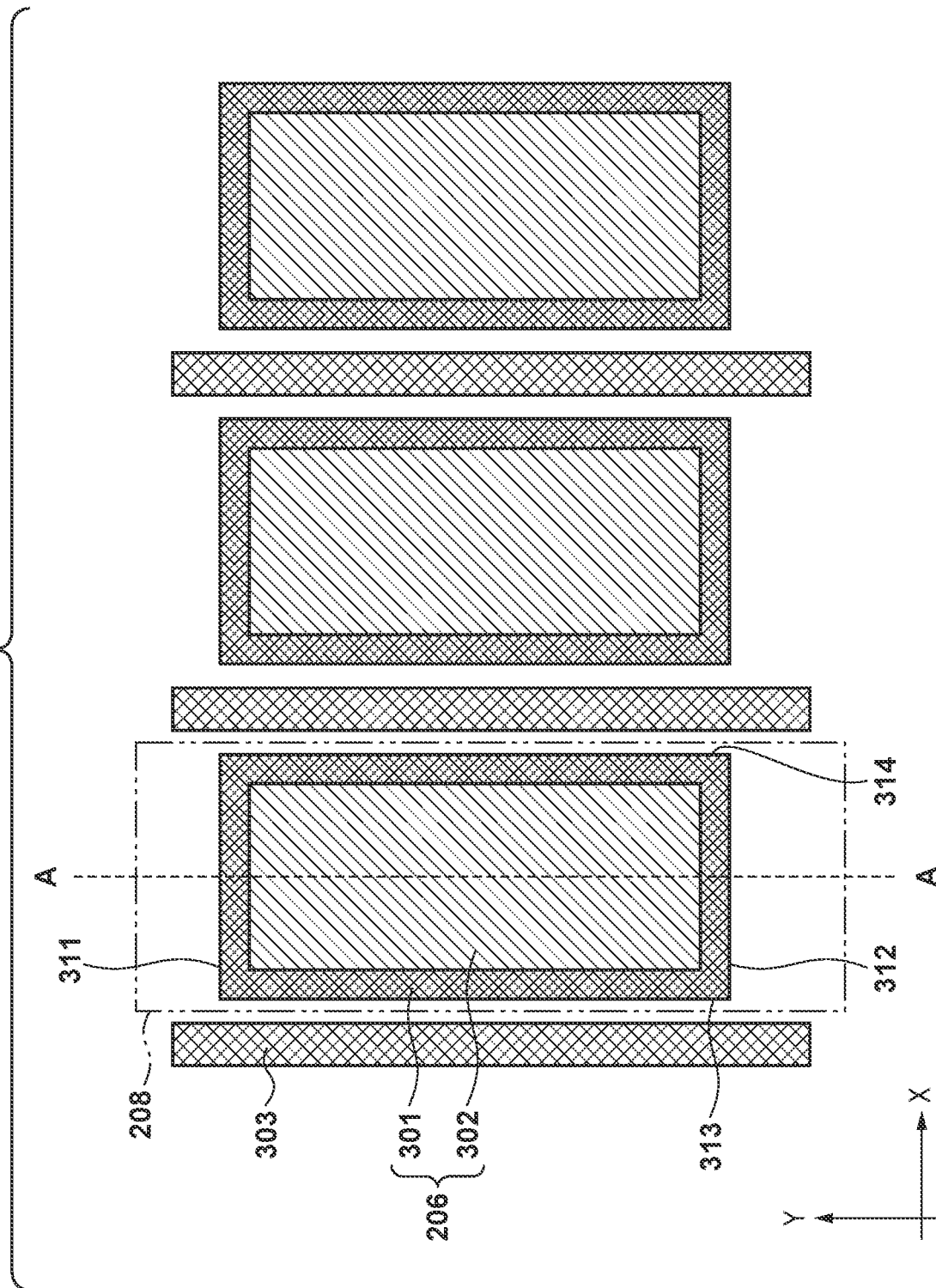
FIG. 3 is a plan view illustrating an example of the configuration of a pixel of the display device of FIG. 1.
Figure 4:
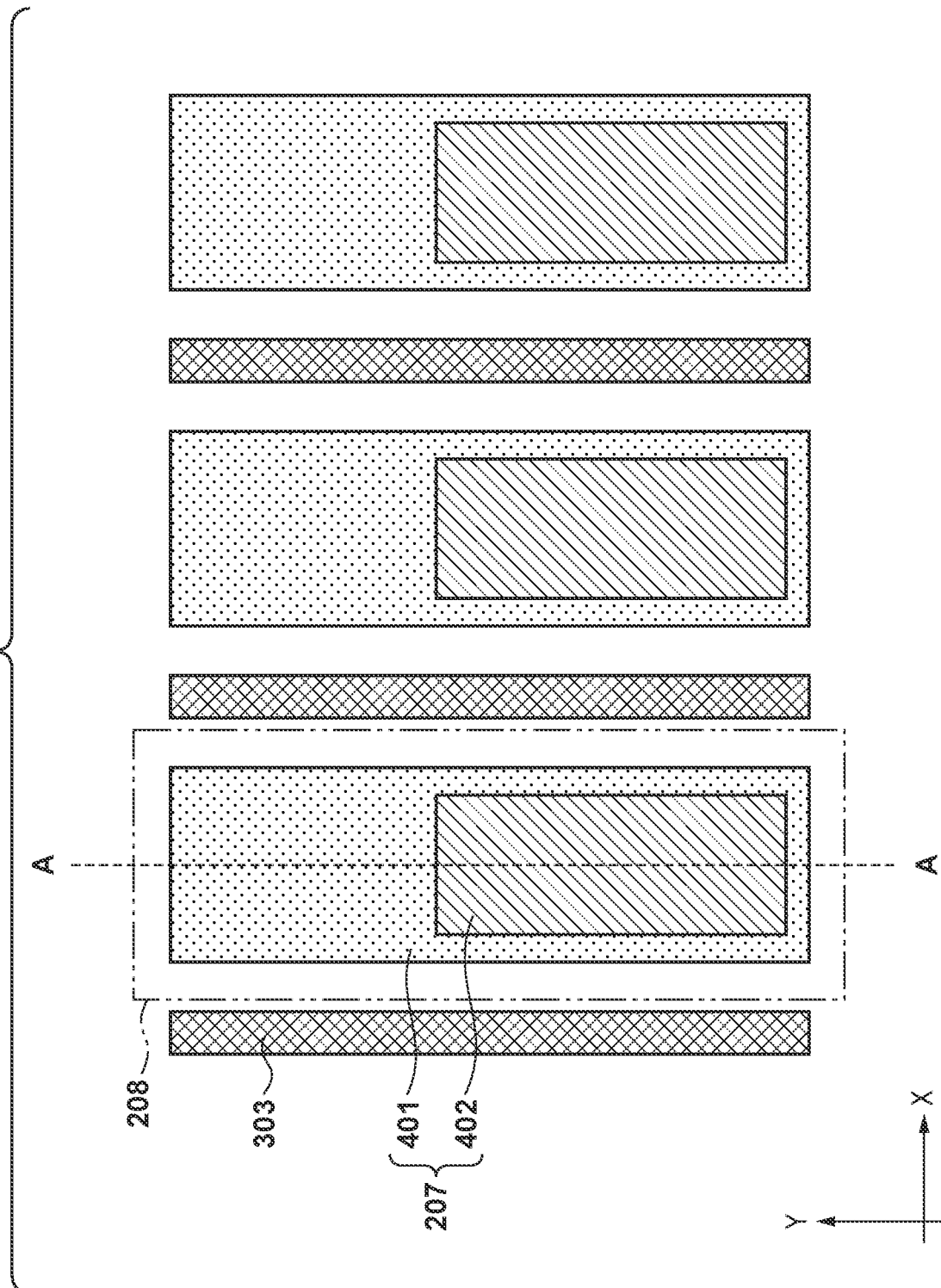
FIG. 4 is a plan view illustrating an example of the configuration of a pixel of the display device of FIG. 1.
Figure 5:
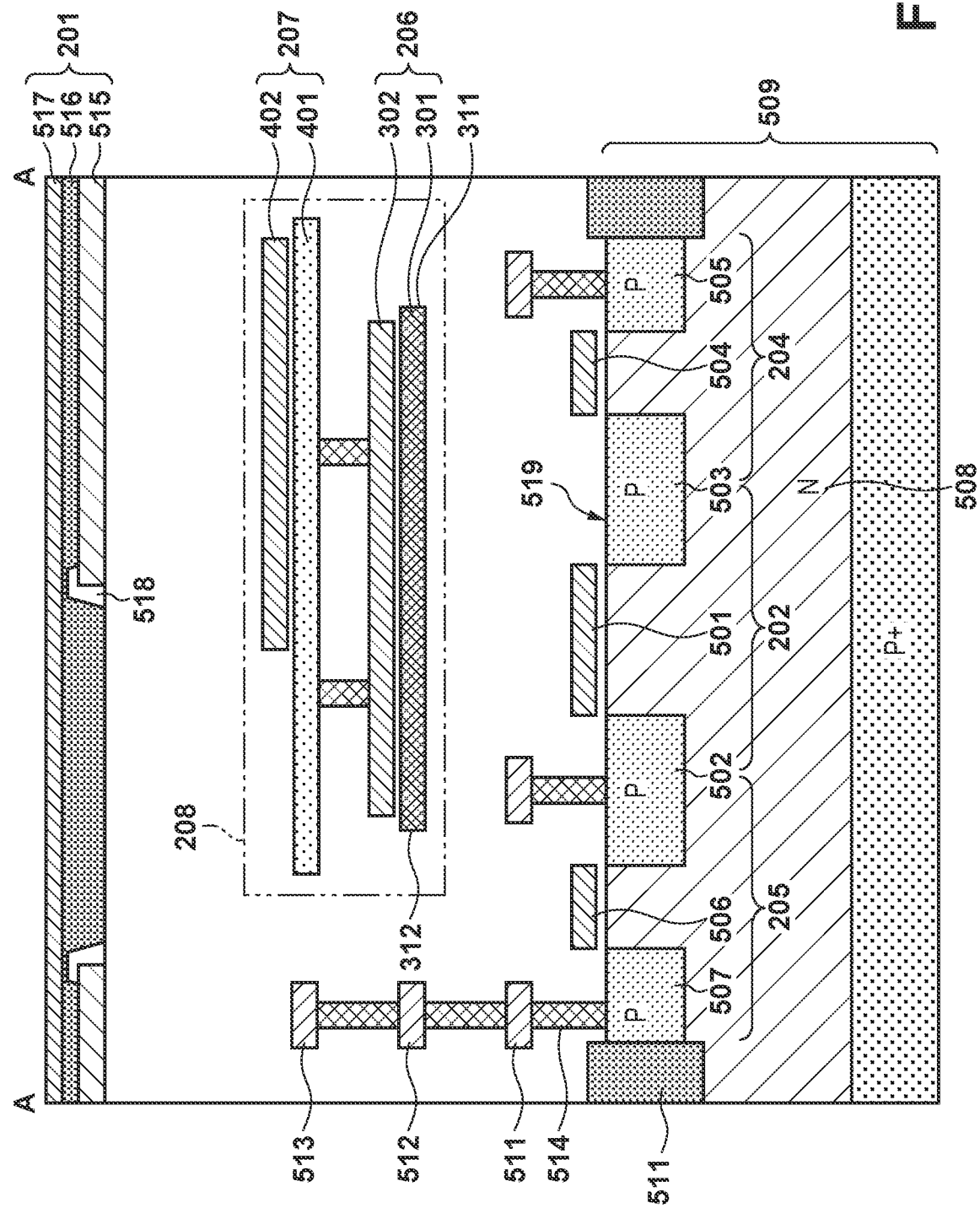
FIG. 5 is a cross-sectional view illustrating an example of the configuration of a pixel of the display device of FIG. 1.

FIG. 3 is an orthographic view, with respect to a front surface 519 of a substrate 509 in which the pixel 102 is arranged, of the capacitive element 206 out of the capacitive element unit 208. In the present specification, an orthographic projection with respect to the front surface 519 of the substrate 509 may be simply referred to as a "plan view". FIG. 4 is an orthographic view, with respect to a front surface 519 of a substrate 509 of the capacitive element 207 out of the capacitive element unit 208. In FIGS. 3 and 4, three pixels worth of capacitive element units 208 are illustrated along an X direction which is a horizontal direction of the figure. FIG. 5 is a cross-sectional view across A-A illustrated in FIGS. 3 and 4. Here, the X direction may be a direction that follows the scanning lines 106, 107, and 108, for example, in the pixel array portion 103 illustrated in FIG.

1. In addition, for example, the X direction may be a direction that follows the signal line 109 in the pixel array portion 103 illustrated in FIG. 1.

As illustrated by FIG. 5, the driving transistor 202, the light emission control transistor 204, and the reset transistor 205 are provided on a side of the front surface 519 which is one main surface of the substrate 509. The writing transistor 203 is similarly provided on the side of the front surface 519 of the substrate 509. As illustrated by FIG. 5, the capacitive element 206 has a structure that has an insulating film such as silicon oxide between the electrode 301 and the electrode 302. The electrode 301 is connected to the gate electrode 501 of the driving transistor 202. The electrode 302 is connected to, from out of the two main terminals of the driving transistor 202, the diffusion region 503 which is the main terminal on the side of the light emission control transistor 204. As illustrated by FIG. 3, in the orthographic projection with respect to the front surface 519 of the substrate 509, in other words in the plan view, the outer edge of the electrode 302 is arranged more to the inside than the outer edge of the electrode 301. However, there is no limitation to this, and, in the plan view, the outer edge of the electrode 301 may be arranged more the inside than the outer edge of the electrode 302. In addition, for example, in the plan view, at one edge the electrode 301 may be arranged more to the inside than the electrode 302, and at another edge, the electrode 302 may be arranged more to the inside than the electrode 301. In addition, for example, in the plan view, the outer edges of the electrode 301 and the electrode 302 may overlap with each other.

In addition, as illustrated by FIGS. 3 to 5, between capacitive element units 208 arranged in pixels 102 that are mutually adjacent in the X direction from out of the plurality of pixels 102, a shielding layer 303 that includes a wiring pattern arranged in at least one wiring layer may be arranged. The shielding layer 303 can block an electric field between the capacitive element units 208 that are mutually adjacent, and suppress crosstalk in accordance with capacitive coupling between capacitive element units 208 that are mutually adjacent. The shielding layer 303 may be connected to the power supply potential Vss or the power supply potential Vdd, and may be connected to another power supply potential. The shielding layer 303 may be a wiring pattern in a straight line form as illustrated by FIGS. 3 and 4. In addition, the wiring pattern of the shielding layer 303 may be provided with the same pattern as in a respective wiring layer, and may be provided with another pattern.

As illustrated by FIG. 5, the capacitive element 207 has a structure that has an insulating film such as silicon oxide between the electrode 401 and the electrode 402. The electrode 401 is connected to, from out of the two main terminals of the driving transistor 202, the diffusion region 503 which is the main terminal on the side of the light emission control transistor 204. The electrode 402 is connected to, from out of the two main terminals of the light emission control transistor 204, the diffusion region 505 which is the main terminal on a side opposite to the driving transistor 202. In other words, in the configuration illustrated by FIG. 2, the electrode 402 is connected to the power supply potential Vdd. As illustrated by FIG. 4, in the plan view, the outer edge of the electrode 402 may be arranged more to the inside than the outer edge of the electrode 401. However, there is no limitation to this, and, in the plan view, the outer edge of the electrode 401 may be arranged more to the inside than the outer edge of the electrode 402. In addition, for example, in the plan view, at one edge the electrode 401 may be arranged more to the inside than the electrode 402, and at another edge, the electrode 402 may be arranged more to the inside than the electrode 401. In addition, for example, in the plan view, the outer edges of the electrode 401 and the electrode 402 may overlap with each other.

As illustrated by FIG. 5, the driving transistor 202 includes the gate electrode 501, and diffusion regions 502 and 503 which are P-type conductivity type diffusion layers. The light emission control transistor 204 includes the gate electrode 504, and diffusion regions 503 and 505 which are P-type conductivity type diffusion layers. The reset transistor 205 includes the gate electrode 506, and diffusion regions 507 and 502 which are P-type conductivity type diffusion layers. Each transistor is provided in the P-type conductivity type substrate 509 in which a N-type conductivity type well 508 is arranged. For example, a semiconductor material such as silicon is used for the substrate 509.

In addition, as illustrated by FIG. 5, an element isolation portion 510 can be provided between respective pixels 102. For the element isolation portion 510, STI (Shallow Trench Isolation), LOCOS (LOCal Oxidation of Silicon) isolation, N-type diffusion layer isolation, or the like may be used as appropriate.

In addition, between respective transistors, between the pixel 102 and the vertical scanning circuit 104, and between the pixel 102 and the signal output circuit 105, there are connections by a wiring pattern arranged in at least one wiring layer. The respective wiring patterns can function as the above-described scanning lines 106, 107, and 108, the signal line 109, and the like. In the configuration illustrated in FIG. 5, the pixel 102 includes wiring patterns 511, 512, and 513 that are arranged in three wiring layers. The wiring patterns 511, 512, and 513 are connected as appropriate through a respective contact via 514 or the like. The above-described shielding layer 303 can have a pattern that uses a wiring layer that is the same as a wiring layer in which the wiring pattern 511, 512, or 513 is arranged. In the configuration illustrated in FIG. 5, three wiring layers are arranged, but the number of wiring layers may be two or less, and may be four or more.

As illustrated by FIG. 5, the light emitting element 201 has a structure that has an organic light emitting layer 516 between an anode 515 that is connected to the driving transistor 202, and a cathode 517 that is connected to the power supply potential Vss. A bank unit 518 is arranged at an end of the anode 515, and it is possible to suppress current that flows between the anode 515 and the cathode 517 from leaking to a pixel 102 which is adjacent.

In the configuration illustrated in FIG. 5, in a cross sectional view in a direction that intersects the front surface 519 of the substrate 509 (hereinafter may simply be referred to as a "cross sectional view"), the capacitive element 206 and the capacitive element 207 are arranged between the light emitting element 201 and the front surface 519 of the substrate 509. In addition, in the cross sectional view, the capacitive element 206 is arranged between the front surface 519 of the substrate 509 and the capacitive element 207. Furthermore, in a plan view, the electrode 301 and the electrode 401 are arranged to overlap. More specifically, the outer edge of the electrode 301 has an edge 311, and an edge 312 opposite to the edge 311. In the present embodiment, the edges 311 and 312 arranged along the X direction. In addition, the outer edge of the electrode 301 has an edge 313 and an edge 314 arranged between the edge 311 and the edge 312. In the present embodiment, the edges 313 and 314 are arranged along a Y direction which is a vertical direction in the figure and which intersects (is orthogonal to) the X direction. In other words, the electrode 301 can be rectangular as illustrated in FIG. 3. In such a case, in the plan view, at least some portions of the edge 311 and the edge 312 out of the outer edge of the electrode 301 are arranged more to the inside than the outer edge of the electrode 401. Due to this configuration, an electric field between the electrode 301 and the anode 515 of the light emitting element 201 is blocked by the electrode 401, and it is possible to reduce static capacitance between the electrode 301 and the anode 515 of the light emitting element 201. Therefore, when the potential of the anode 515 has increased, it is possible to suppress potential variation of the electrode 301 due to capacitive coupling between the electrode 301 and the anode 515. In other words, it is possible to suppress fluctuation of the voltage of a luminance signal held between the electrode 301 and the electrode 302, and it is possible to suppress display unevenness of a displayed image. As a result, it is possible to realize improvements in image quality of the display device 101.

In the configuration illustrated in FIG. 5, in the cross sectional view, the electrode 301 is arranged between the electrode 302 and the front surface 519 of the substrate 509. In addition, in a direction that intersects the front surface 519 of the substrate 509, the electrode 401 is arranged between the electrode 402 and the front surface 519 of the substrate 509. However, there is no limitation to this, and, for example, the electrode 402 may be arranged between the electrode 401 and the front surface 519 of the substrate 509.

Figure 6:
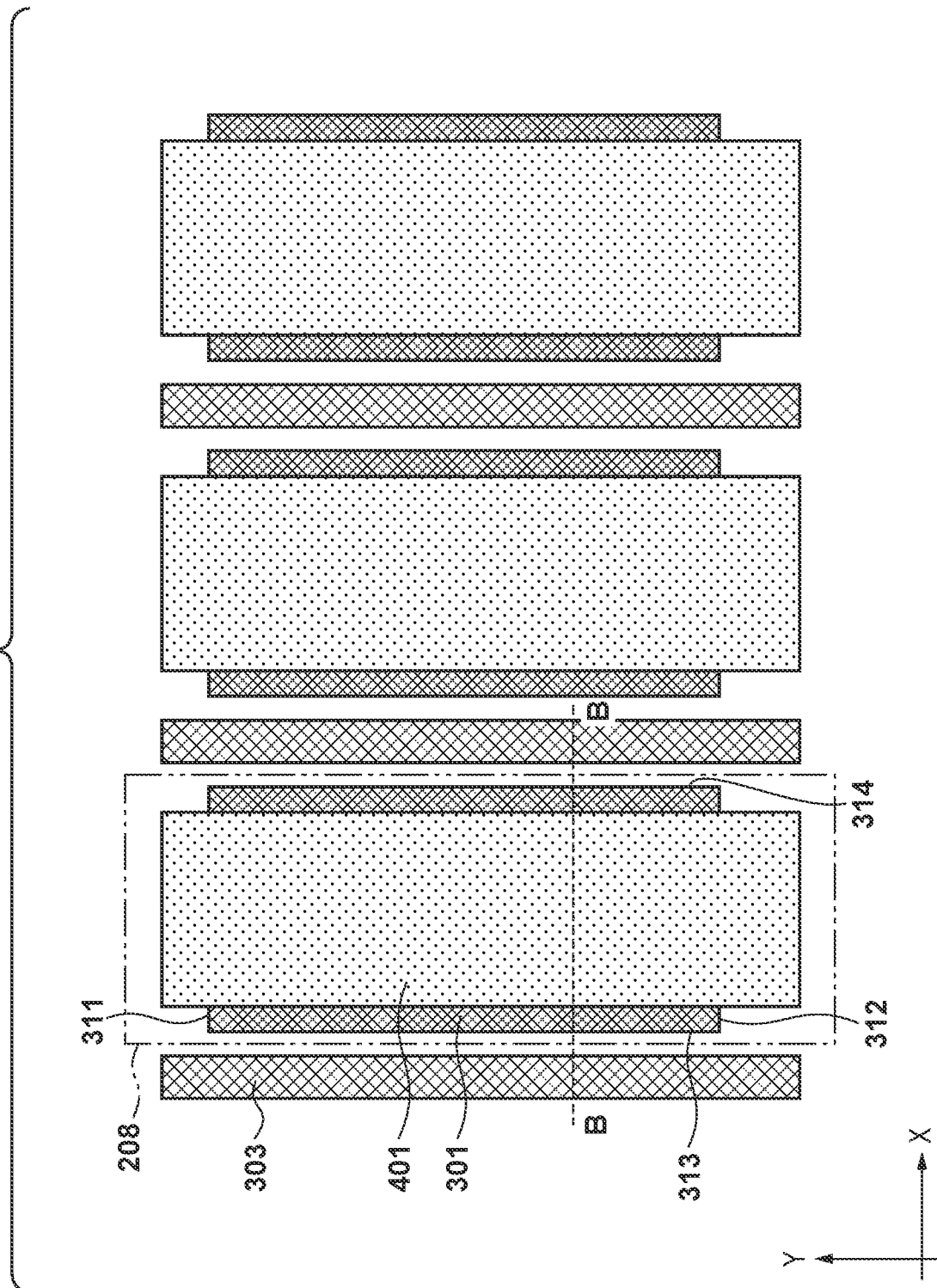
FIG. 6 is a plan view illustrating an example of the configuration of a pixel of the display device of FIG. 1.
Figure 7:
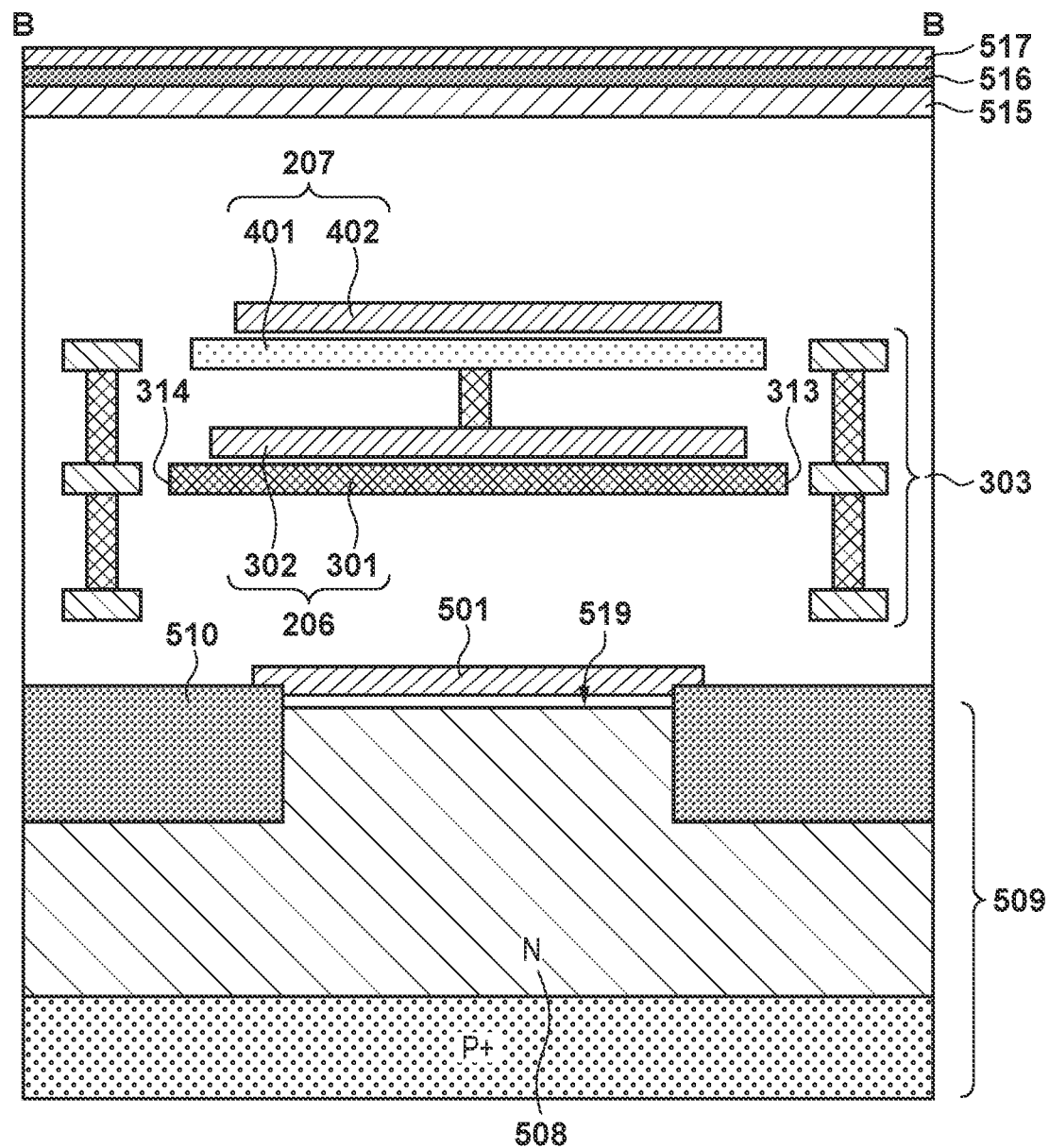
FIG. 7 is a cross-sectional view illustrating an example of the configuration of a pixel of the display device of FIG. 1.

FIG. 6 is an orthographic view, with respect to a front surface 519 of a substrate 509 for the electrode 301 and the electrode 401 out of the capacitive element unit 208. FIG. 7 is a cross-sectional view across B-B illustrated in FIG. 6.

In the X direction that follows the edges 311 and 312, the shielding layer 303 is arranged between pixels 102 that are mutually adjacent, as described above. By the shielding layer 303, it is possible to block an electric field between the electrode 301 and the anode 515 of the light emitting element 201. Accordingly, as illustrated by FIG. 7, in the plan view, the edge 313 and the edge 314 that are edges of the electrode 301 in the X direction are arranged more to the outside than the electrode 401.

In contrast, in the configuration illustrated in FIG. 6, in the Y direction that follows the edges 313 and 314, the shielding layer 303 is not arranged adjacent to the capacitive element unit 208. Accordingly, as illustrated by FIGS. 5 and 6, in the plan view, the edges 311 and 312 that are edges of the electrode 301 in the Y direction are arranged more to the inside than the outer edges of the electrode 401. In addition, in the configuration illustrated in FIG. 6, although the shielding layer 303 is not arranged between capacitive element units 208 of pixels 102 that are mutually adjacent in the Y direction, the shielding layer 303 may be arranged there. Here, in the pixel array portion 103 illustrated in FIG. 1, in the case where the X direction is a direction that follows the scanning lines 106, 107, and 108, the Y direction can be a direction that follows the signal line 109. In addition, for example, in the pixel array portion 103 illustrated in FIG. 1, if the X direction is a direction that follows the signal line 109, the Y direction can be a direction that follows the scanning lines 106, 107, and 108.

In addition, as described above, the shielding layer 303 has an effect of blocking an electric field between the electrode 301 and the anode 515 of the light emitting element 201. Accordingly, as illustrated by FIG. 7, in the cross sectional view, the electrode 301 may be arranged at a height between the front surface 519 of the substrate 509 and a wiring pattern arranged in a wiring layer most separated from the front surface 519 of the substrate 509 from out of the wiring patterns included in the shielding layer 303. As illustrated by FIG. 6, the shielding layer 303 may include a wiring pattern that is arranged into many wiring layers. In addition, as illustrated by FIG. 7, the wiring patterns of respective shielding layers 303 may be mutually connected.

Figure 8:
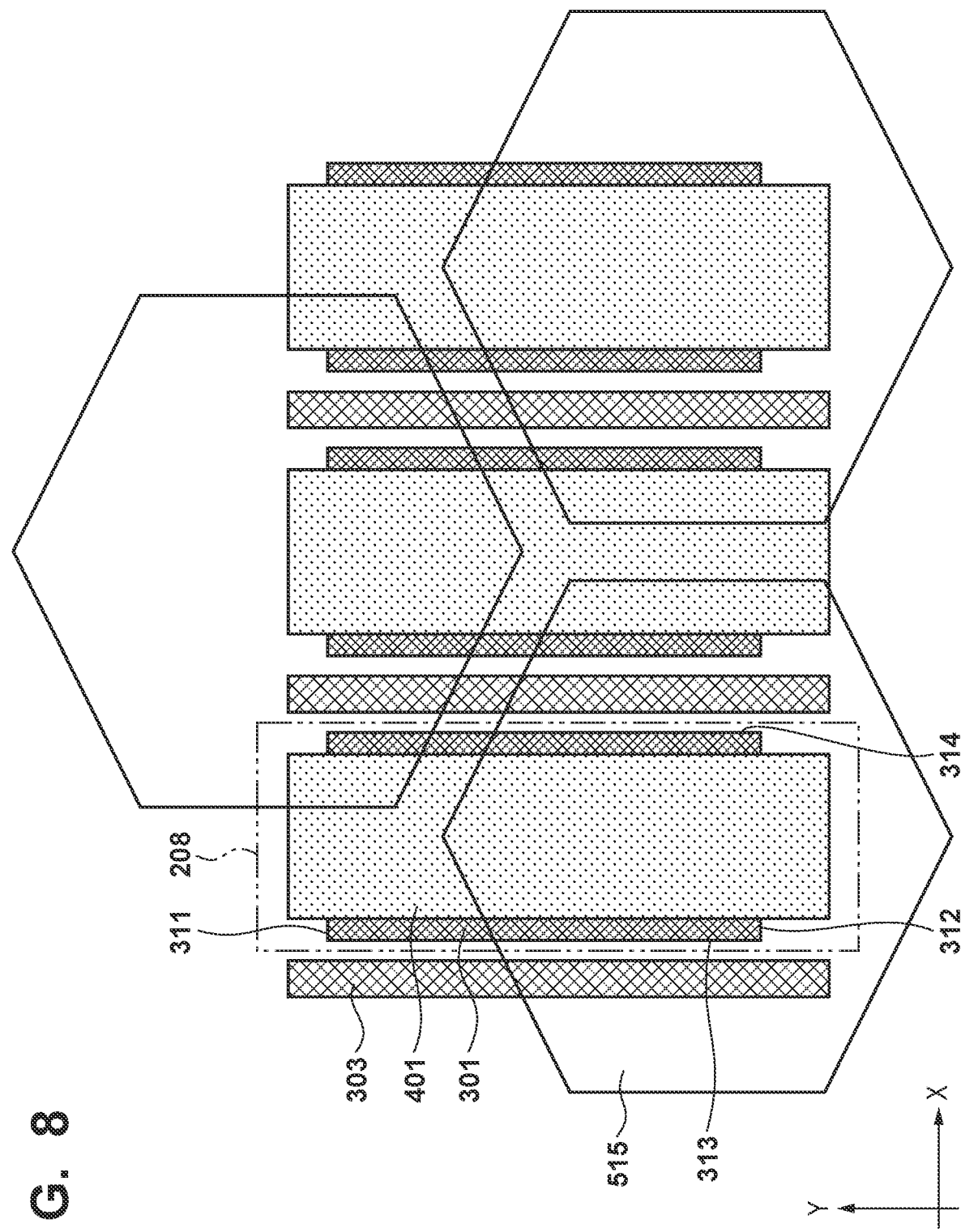
FIG. 8 is a plan view illustrating an example of the configuration of a pixel of the display device of FIG. 1.

FIG. 8 is an orthographic view, with respect to a front surface 519 of a substrate 509 for the capacitive element unit 208 and the anode 515 of the light emitting element 201. In the configuration illustrated in FIG. 8, the anode 515 has a polygonal shape (is a hexagon here), is arranged to be staggered for each adjacent pixel 102, and partially overlaps the electrode 401 and the shielding layer 303. The shape and arrangement of the light emitting element 201 is not limited to this, and can be changed as appropriate. For example the anode 515 may have a rectangular shape, and may be arranged for each pixel 102 in a single straight line for each row in the X direction.

Figure 9:
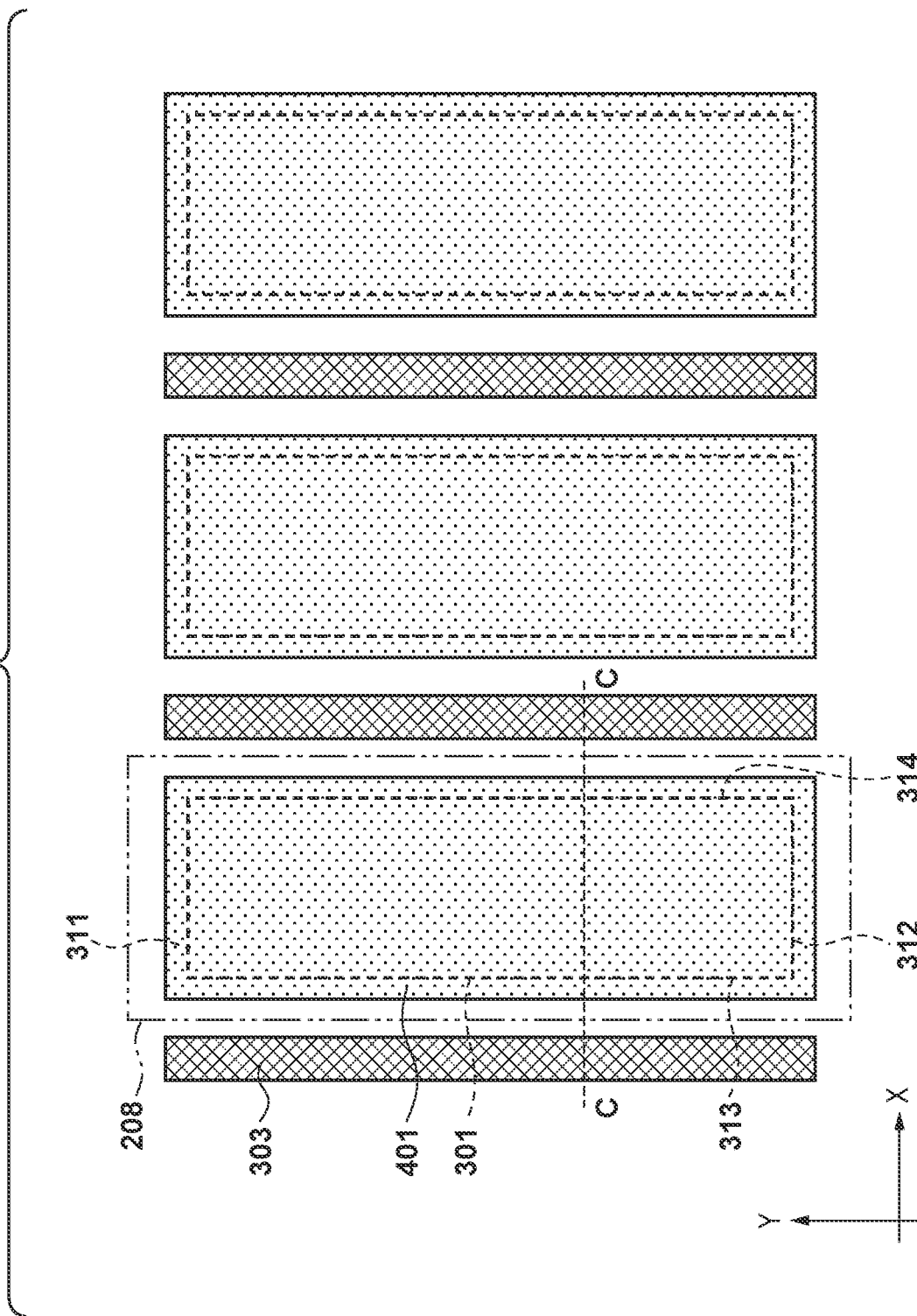
FIG. 9 is a plan view illustrating an example of the configuration of a pixel of the display device of FIG. 1.
Figure 10:
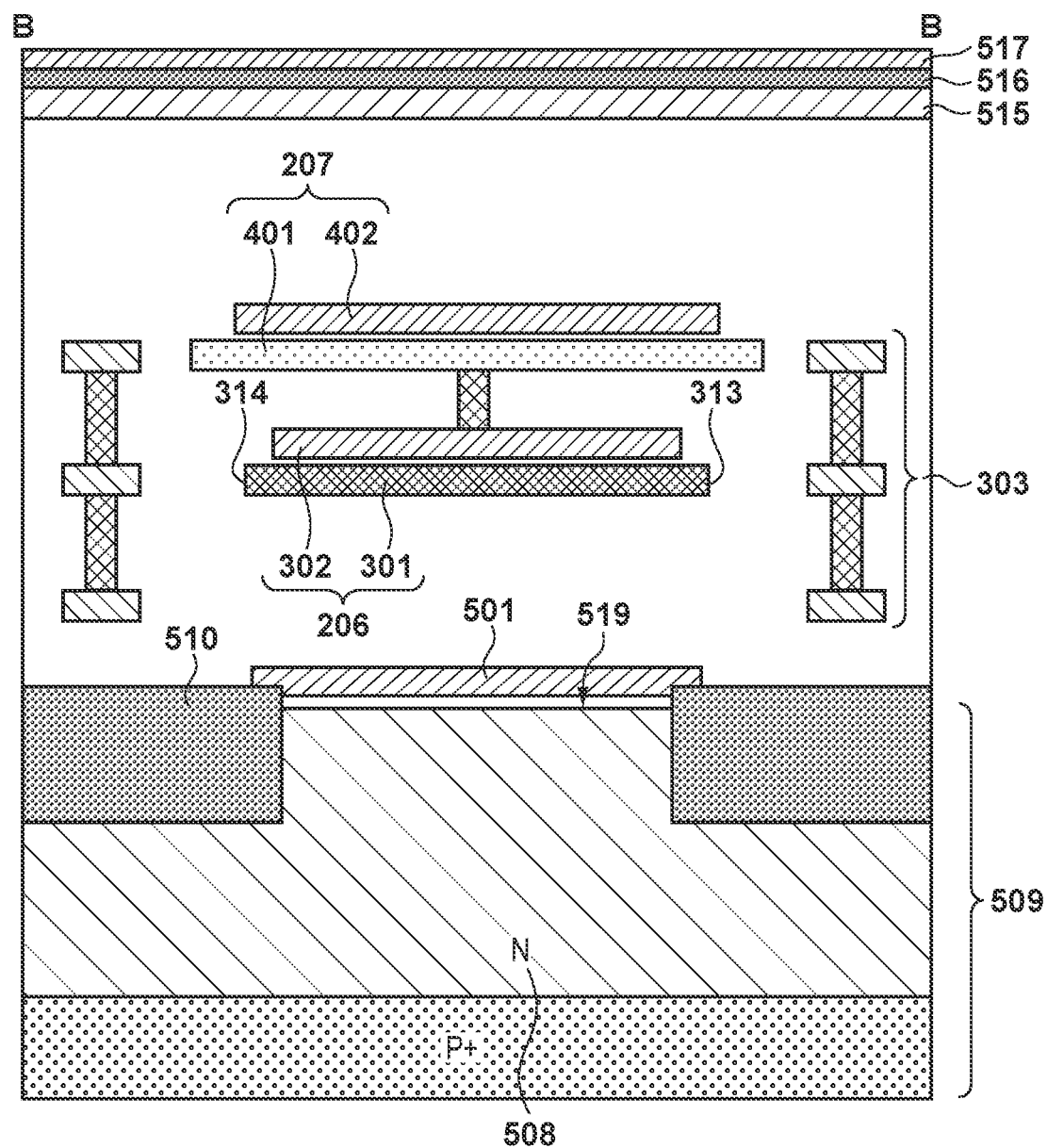
FIG. 10 is a cross-sectional view illustrating an example of the configuration of a pixel of the display device of FIG. 1.

Next, using FIGS. 9 and 10, description is given for a variation of the electrode 301 and the electrode 401 illustrated in FIGS. 6 and 7. FIG. 9 is an orthographic view, with respect to a front surface 519 of a substrate 509 for the electrode 301 and the electrode 401 out of the capacitive element unit 208. FIG. 10 is a cross-sectional view across C-C illustrated in FIG. 9.

In the configuration illustrated by FIGS. 9 and 10, in the plan view, the entirety of the outer edge of the electrode 301 is arranged more to the inside than the outer edge of the electrode 401. In other words, as illustrated by FIGS. 9 and 10, in the cross sectional view, the electrode 301 is arranged directly below the electrode 401, and in the plan view, the electrode 301 may completely overlap with respect to the electrode 401. In other words, in the plan view, the edges 311 to 314 of the electrode 301 are arranged at positions that overlap with the electrode 401. By this, it is possible further reduce static capacitance between the electrode 301 and the anode 515 of the light emitting element 201.

Figure 11:
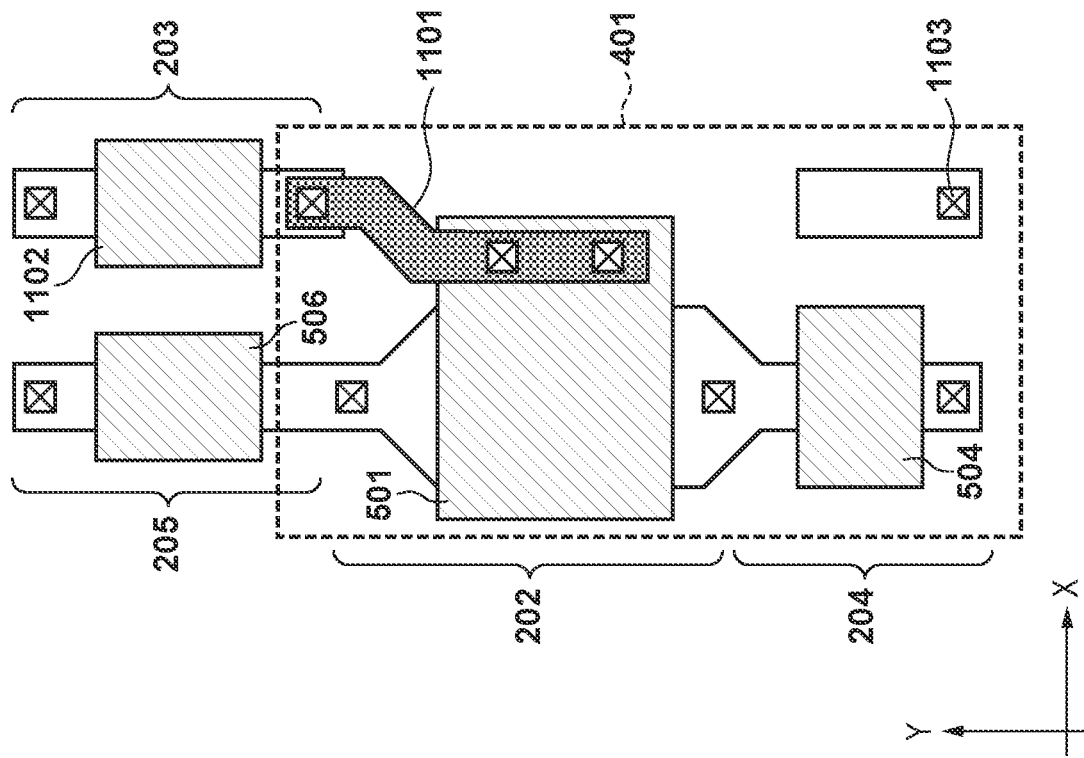
FIG. 11 is a plan view illustrating an example of the configuration of a pixel of the display device of FIG. 1.
Figure 12:
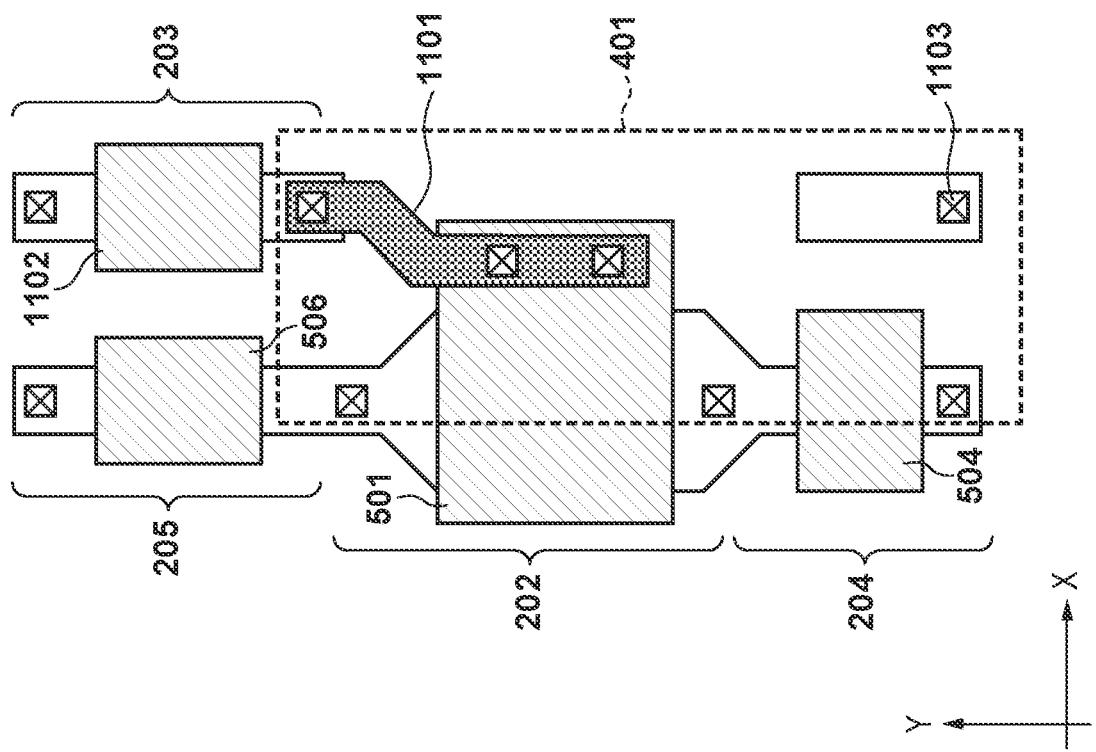
FIG. 12 is a plan view illustrating an example of the configuration of a pixel of the display device of FIG. 1.

Next, using FIGS. 11 and 12, description is given regarding the capacitive element unit 208 and each transistor arranged in the pixel 102. FIGS. 11 and 12 are orthographic views with respect to the front surface 519 of the substrate 509, of the driving transistor 202, the writing transistor 203, the light emission control transistor 204, the reset transistor 205, and the electrode 401. FIGS. 11 and 12 also illustrate a wiring pattern 1101 that connects the gate electrode 501 of the driving transistor 202 with a main terminal of the writing transistor 203, and a well contact unit 1102 that applies the power supply potential Vdd to the N-type well 508.

The wiring pattern 1101 is arranged at a height between the electrode 401 and the front surface 519 of the substrate 509, in the cross sectional view. In such a case, in the plan view, arrangement is such that the wiring pattern 1101 and the electrode 401 overlap. Furthermore, as illustrated by FIG. 11, the entirety of the outer edge of the wiring pattern 1101 may be arranged more to the inside than the outer edge of the electrode 401. By arranging so that the wiring pattern 1101 and the electrode 401 overlap, it is possible to reduce static capacitance between the wiring pattern 1101 and the anode 515 of the light emitting element 201. In other words, it is possible to further suppress potential variation of the electrode 301 which is connected to the wiring pattern 1101.

In addition, as illustrated by FIG. 12, in the plan view, the outer edge of the gate electrode 501 of the driving transistor 202 may be arranged more to the inside than the outer edge of the electrode 401. Furthermore, in the plan view, the driving transistor 202 and the light emission control transistor 204 may be arranged more to the inside than the outer edge of the electrode 401. By arranging so that the gate electrode 501 and the electrode 401 overlap, it is possible to reduce static capacitance between the gate electrode 501 of the driving transistor 202 and the anode 515 of the light emitting element 201. In other words, it is possible to further suppress potential variation of the electrode 301 which is connected to the gate electrode 501 of the driving transistor 202.

While embodiments according to the present invention were described above, it goes without saying that the present invention is not limited to these embodiments, and the above-described embodiments can be modified and combined as appropriate within a scope that does not deviate from the spirit of the present invention. For example, the writing transistor 203 and the light emission control transistor 204 may be configured by N-type transistors.

The display device 101 as described above can be incorporated in various electronic devices. It is possible to give cameras, computers, portable terminals, in-vehicle display devices, and the like as examples of such electronic devices. An electronic device can include, for example, the display device 101, and a control unit that controls driving of the display device 101.

Figure 13:
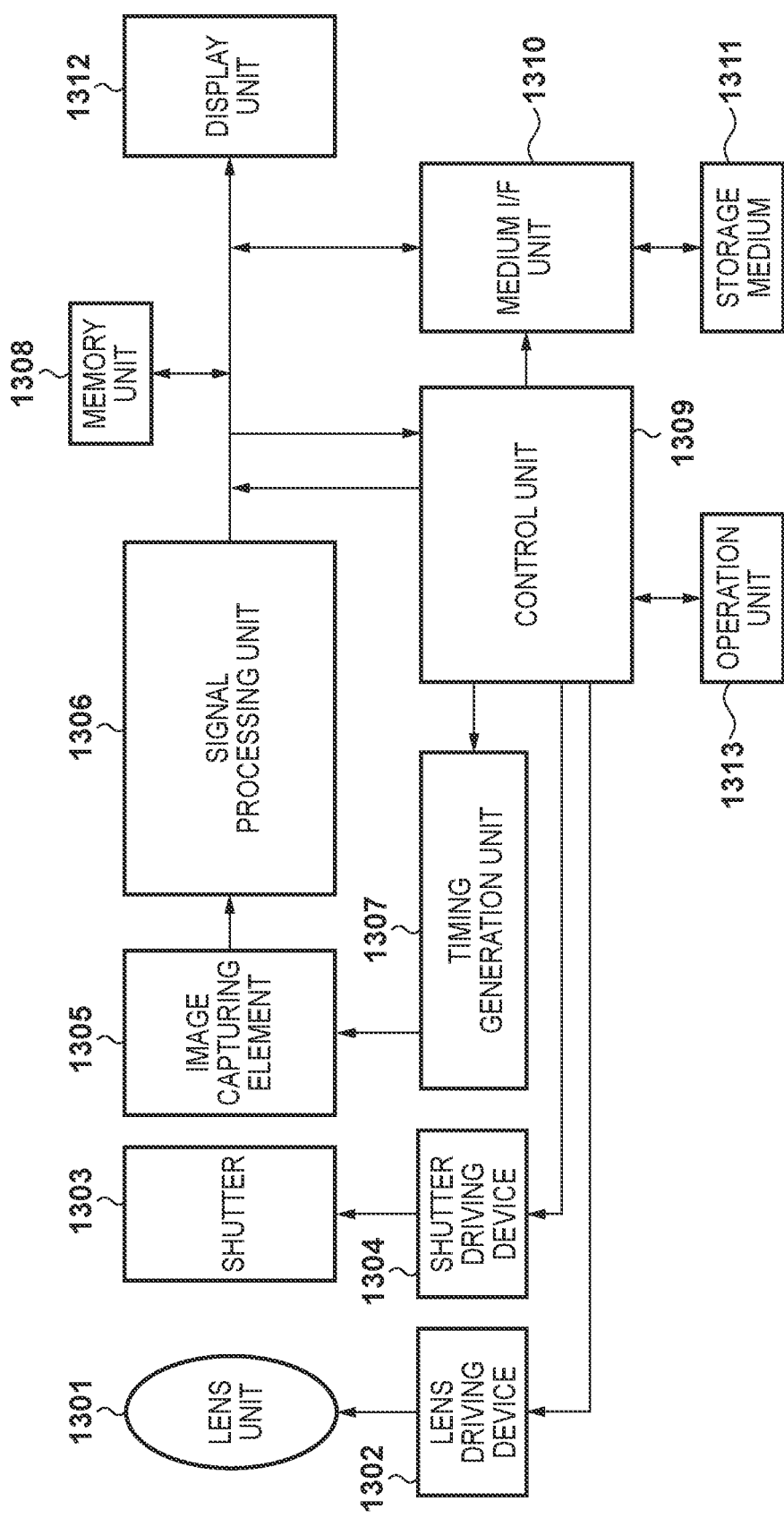
FIG. 13 is a block diagram illustrating an example of a configuration of a camera using the display device of FIG. 1.

Here, an embodiment in which the above-described display device 101 is applied to a display unit of a digital camera will be described with reference to FIG. 13. A lens unit 1301 is an image capturing optical system for forming an optical image of a subject on an image capturing element 1305, and has a focus lens, a variable magnification lens, a diaphragm, and the like. Driving of a focus lens position, a magnification lens position, an opening diameter of an aperture, and the like in the lens unit 1301 is controlled by a control unit 1309 through a lens driving device 1302.

A mechanical shutter 1303 is arranged between the lens unit 1301 and the image capturing element 1305, and the driving is controlled by the control unit 1309 through a shutter driving device 1304. The image capturing element 1305 converts an optical image formed by the lens unit 1301 by a plurality of pixels into an image signal. A signal processing unit 1306 performs A/D conversion, demosaic processing, white balance adjustment processing, encoding processing, and the like on the image signal which is outputted from the image capturing element 1305.

A timing generation unit 1307 outputs various timing signals to the image capturing element 1305 and the signal processing unit 1306. The control unit 1309 has, for example, a memory (ROM, RAM) and a microprocessor (CPU), and realizes various functions of the digital camera by loading a program stored in the ROM into the RAM and the CPU executing the program to control each unit. Functions realized by the control unit 1309 include automatic focus detection (AF) and automatic exposure control (AE).

A memory unit 1308 is used as a work region, and the control unit 1309 or the signal processing unit 1306 temporarily store image data in the memory unit 1308. A medium OF unit 1310 is an interface for reading and writing from/to a storage medium 1311, which is a detachable memory card, for example. A display unit 1312 displays a captured image and various information of the digital camera. The display device 101 described above can be applied to the display unit 1312. The display device 101 mounted on the digital camera as the display unit 1312 is driven by the control unit 1309 to display images and various information. The operation unit 1313 is a user interface such as a power switch, a release button, and a menu button for the user to make an instruction or a setting with respect to the digital camera.

Next, the operation of the digital camera at a time of capturing will be described. When the power is turned on, the camera enters a capture standby state. The control unit 1309 starts moving image capturing processing and display processing for causing the display unit 1312 (the display device 101) to operate as an electronic viewfinder. When an image capturing preparation instruction (for example, a half-press of a release button of the operation unit 1313) is inputted in the capture standby state, the control unit 1309 starts focus detection processing.

Then, the control unit 1309 obtains a movement amount and a movement direction of the focus lens of the lens unit 1301 from an obtained defocus amount and direction, drives the focus lens through the lens driving device 1302, and adjusts the focus of the imaging optical system. After the driving, the focus lens position may be finely adjusted by further performing focus detection based on a contrast evaluation value, as necessary.

Thereafter, when an image capturing start instruction (for example, a full press of the release button) is input, the control unit 1309 executes a capturing operation for storing, and the obtained image data is processed by the signal processing unit 1306 and stored in the memory unit 1308. Then, the control unit 1309 stores the image data stored in the memory unit 1308 into the storage medium 1311 through the medium control I/F unit 1310. At this time, the control unit 1309 may drive the display unit 1312 (display device 101) so as to display the captured image. The control unit 1309 may output image data from an external OF unit (not illustrated) to an external device such as a computer.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-209195, filed Nov. 6, 2018, which is hereby incorporated by reference herein in its entirety.

What is claimed is:

1. A light emitting device in which a plurality of pixels are arranged in an array,
wherein each of the plurality of pixels includes (a) a light emitting element; (b) a first transistor, provided over a substrate, the first transistor being connected to the light emitting element; (c) a first capacitive element that includes a first electrode and a second electrode; and (d) a metal layer,
wherein the first electrode is connected to a gate electrode of the first transistor,
wherein in a cross sectional view, (a) the first capacitive element and the metal layer are arranged between the light emitting element and the substrate, and (b) the first capacitive element is arranged between the substrate and the metal layer,
wherein in a plan view, (a) an outer edge of the first electrode has a first side and a second side opposite the first side, and (b) at least one of the first side and the second side are arranged more to an inside than an outer edge of the metal layer.

2. The light emitting device according to claim 1, wherein, in the cross sectional view, the first electrode is arranged between the second electrode and the substrate.

3. The light emitting device according to claim 1, wherein the light emitting device further comprises a shielding layer disposed between the plurality of pixels in the plan view.

4. The light emitting device according to claim 3, wherein a plurality of the shielding layers are disposed at each position between the plurality of the pixels.

5. The light emitting device according to claim 1, wherein, in the plan view, both of the first side and the second side are arranged more to an inside than an outer edge of the metal layer.

6. The light emitting device according to claim 1, wherein each of the plurality of pixels further includes a second transistor configured to transmit the luminance signal to the gate electrode of the first transistor,
wherein in the cross sectional view, a wiring pattern for connecting the gate electrode of the first transistor and a main terminal of the second transistor is arranged between the first electrode and the substrate, and
wherein in the plan view, the wiring pattern for connecting the gate electrode of the first transistor and the main terminal of the second transistor is arranged to overlap with the first electrode.

7. The light emitting device according to claim 6, wherein, in the plan view, an outer edge of the wiring pattern for connecting the gate electrode of the first transistor and the main terminal of the second transistor is arranged more to the inside than the outer edge of the first electrode.

8. The light emitting device according to claim 1 wherein, in the plan view, the gate electrode of the first transistor is arranged more to the inside than the outer edge of the first electrode.

9. The light emitting device according to claim 1, wherein each of the plurality of pixels further includes a third transistor for shorting two electrodes of the light emitting element.

10. The light emitting device according to claim 1, wherein, in the plan view, an outer edge of the second electrode is arranged more to the inside than the outer edge of the first electrode.

11. The light emitting device according to claim 6, wherein, in the plan view, an outer edge of the second electrode is arranged more to the inside than the outer edge of the first electrode.

12. The light emitting device according to claim 1, wherein, in the plan view, the outer edge of the gate electrode of the first transistor is arranged more to the inside than the outer edge of the first electrode.

13. An electronic device comprising:
the light emitting device according to claim 1; and
a control unit configured to control driving of the light emitting device.

14. A light emitting device in which a plurality of pixels are arranged in an array,
wherein each of the plurality of pixels includes (a) a light emitting element including a light emitting layer; (b) a first transistor, provided on a substrate, configured to supply current in accordance with a luminance signal to the light emitting element; (c) a second transistor, provided on the substrate, configured to control emission or non-emission of the light emitting element; (d) a first capacitive element that includes a first electrode and a second electrode; and (e) a second capacitive element that includes a third electrode and a fourth electrode,
wherein the first electrode is connected to a gate electrode of the first transistor,
wherein the second electrode and the third electrode are connected to, from among two main terminals of the first transistor, a main terminal on a side of the second transistor,
wherein the fourth electrode is connected to, from among the two main terminals of the second transistor, a main terminal on a side opposite the first transistor,
wherein in a cross sectional view, (a) the first capacitive element and the second capacitive element are arranged between the light emitting element and the substrate, and (b) the first capacitive element is arranged between the substrate and the second capacitive element, and
wherein in a plan view, (a) an outer edge of the first electrode has a first side and a second side opposite the first side, and (b) at least a portion of each of the first side and the second side are arranged more to an inside than an outer edge of the third electrode.

15. The light emitting device according to claim 14, wherein, in the cross sectional view, the first electrode is arranged between the second electrode and the substrate.

16. The light emitting device according to claim 14, wherein, in the cross sectional view, the third electrode is arranged between the fourth electrode and the substrate.

17. The light emitting device according to claim 14, wherein the first capacitive element and the second capacitive element configure a capacitive element unit, and
wherein a shielding layer that includes a wiring pattern arranged in at least one wiring layer is arranged in the capacitive element unit that is arranged between pixels, from among the plurality of pixels, that are mutually adjacent in a direction that follows the first side.

18. The light emitting device according to claim 17, wherein, in the cross sectional view, the first electrode is arranged between the substrate and a wiring pattern arranged in a wiring layer most separated from the substrate from among wiring patterns included in the shielding layer.

19. The light emitting device according to claim 17, wherein, in the plan view, a third edge and a fourth edge arranged between the first side and the second side of the first electrode are arranged more to an outside than the third electrode.

20. The light emitting device according to claim 14, wherein, in the plan view, the outer edge of the first electrode is arranged more to the inside than the outer edge of the third electrode.

21. The light emitting device according to claim 14, wherein each of the plurality of pixels further includes a third transistor configured to transmit the luminance signal to the gate electrode of the first transistor,
wherein in the cross sectional view, a wiring pattern for connecting the gate electrode of the first transistor and a main terminal of the third transistor is arranged between the third electrode and the substrate, and
wherein in the plan view, the wiring pattern for connecting the gate electrode of the first transistor and the main terminal of the third transistor is arranged to overlap with the third electrode.

22. The light emitting device according to claim 21, wherein, in the plan view, an outer edge of the wiring pattern for connecting the gate electrode of the first transistor and the main terminal of the third transistor is arranged more to the inside than the outer edge of the third electrode.

23. The light emitting device according to claim 14, wherein, in the plan view, the gate electrode of the first transistor is arranged more to the inside than the outer edge of the third electrode.

24. The light emitting device according to claim 14, wherein each of the plurality of pixels further includes a fourth transistor for shorting two electrodes of the light emitting element.

25. The light emitting device according to claim 14, wherein, in the plan view, an outer edge of the second electrode is arranged more to the inside than the outer edge of the first electrode.

26. The light emitting device according to claim 14, wherein, in the plan view, an outer edge of the fourth electrode is arranged more to the inside than the outer edge of the third electrode.

27. The light emitting device according to claim 14, wherein, in the plan view, the outer edge of the gate electrode of the first transistor is arranged more to the inside than the outer edge of the third electrode.

28. The light emitting device according to claim 14, wherein, in the plan view, the first transistor and the second transistor are arranged more to the inside than the outer edge of the third electrode.

29. An electronic device comprising:
   the light emitting device according to claim 14; and
   a control unit configured to control driving of the light emitting device.

* * * * *